(12) United States Patent
Xiao et al.

(10) Patent No.: US 11,862,642 B2
(45) Date of Patent: Jan. 2, 2024

(54) DISPLAY PANEL, ARRAY SUBSTRATE, AND MANUFACTURING METHOD THEREOF

(71) Applicant: Wuhan China Star Optoelectronics Technology Co., Ltd., Hubei (CN)

(72) Inventors: Juncheng Xiao, Hubei (CN); Yong Xu, Hubei (CN); Fei Ai, Hubei (CN); Dewei Song, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 722 days.

(21) Appl. No.: 16/966,119

(22) PCT Filed: Apr. 20, 2020

(86) PCT No.: PCT/CN2020/085726
§ 371 (c)(1),
(2) Date: Jul. 30, 2020

(87) PCT Pub. No.: WO2021/203462
PCT Pub. Date: Oct. 14, 2021

(65) Prior Publication Data
US 2023/0163136 A1    May 25, 2023

(30) Foreign Application Priority Data
Apr. 8, 2020 (CN) .......................... 202010271441.0

(51) Int. Cl.
*H01L 27/00* (2006.01)
*H01L 29/00* (2006.01)
*H01L 27/12* (2006.01)

(52) U.S. Cl.
CPC ...... *H01L 27/1225* (2013.01); *H01L 27/1285* (2013.01); *H01L 27/1288* (2013.01)

(58) Field of Classification Search
CPC ............. H01L 27/1225; H01L 27/1285; H01L 27/1288; H01L 27/1248; H01L 27/12;
(Continued)

(56) References Cited

U.S. PATENT DOCUMENTS 9,190,423 B2 * 11/2015 Shin ...................... H01L 29/786
9,600,109 B2 * 3/2017 Oh ........................ G06F 3/0446
(Continued)

FOREIGN PATENT DOCUMENTS

| CN | 102193230 | 9/2011 |
| CN | 103123429 | 5/2013 |

(Continued)

*Primary Examiner* — Nikolay K Yushin (57) ABSTRACT

A display panel, an array substrate, and a manufacturing method thereof, wherein the array substrate includes a thin film transistor device, and an interface layer, a first transparent conductive layer, a passivation layer, and a second transparent conductive layer which are formed on the thin film transistor device in sequence. By replacing a planarization layer in the prior art with the interface layer, performing a gate re-etching process, and perforating the interface layer and the passivation layer to simultaneously form a deep via and a shallow via, a number of photomasks required to form the array substrate is reduced to 8. It effectively reduces costs of production materials and costs of photomasks.

18 Claims, 4 Drawing Sheets

(58) Field of Classification Search
CPC ............. H01L 27/1214; H01L 27/1259; H01L 29/66757; H01L 29/66; H01L 29/78675; H01L 29/786; H01L 29/78633
See application file for complete search history.

(56) References Cited

U.S. PATENT DOCUMENTS

| | | |
|---|---|---|
| 2003/0197180 A1 | 10/2003 | Tsujimura et al. |
| 2011/0227851 A1* | 9/2011 | Oh ......................... G06F 3/047 345/173 |
| 2011/0310341 A1 | 12/2011 | Kim et al. |
| 2015/0001541 A1* | 1/2015 | Shin ................... H01L 27/1248 257/59 |
| 2016/0233251 A1 | 8/2016 | Sasaki |
| 2017/0373098 A1 | 12/2017 | Hirano et al. |
| 2019/0346711 A1 | 11/2019 | Yeh et al. |
| 2020/0201469 A1 | 6/2020 | Oh et al. |
| 2020/0321475 A1 | 10/2020 | Zhang et al. |

FOREIGN PATENT DOCUMENTS

| | | |
|---|---|---|
| CN | 104749835 | 7/2015 |
| CN | 105870125 | 8/2016 |
| CN | 107112367 | 8/2017 |
| CN | 108447822 | 8/2018 |
| CN | 110349859 | 10/2019 |
| CN | 110471551 | 11/2019 |
| KR | 10-2012-0107269 | 10/2012 |
| KR | 10-2013-0103206 | 9/2013 |
| TW | 548738 | 8/2003 |

\* cited by examiner

DISPLAY PANEL, ARRAY SUBSTRATE, AND MANUFACTURING METHOD THEREOF

RELATED APPLICATIONS

This application is a National Phase of PCT Patent Application No. PCT/CN2020/085726 having International filing date of Apr. 20, 2020, which claims the benefit of priority of Chinese Patent Application No. 202010271441.0 filed on Apr. 8, 2020. The contents of the above applications are all incorporated by reference as if fully set forth herein in their entirety.

FIELD AND BACKGROUND OF THE INVENTION

The present invention relates to a display technology field, and more particularly, to a display panel, an array substrate, and a manufacturing method thereof.

With development of display panel technology, low temperature poly-silicon (LTPS) thin film transistor array substrates have become increasingly popular, and gradually replaced amorphous silicon (a-Si) thin film transistor array substrates. Although only 4 to 5 photomasks are required to manufacture the amorphous silicon thin film transistor array substrate, the low temperature poly-crystalline silicon thin film transistor array substrate has gradually become a mainstream and widely used in display panels with small size and high resolution due to its higher mobility and better electrical performance. However, due to complex processes for manufacturing the low temperature poly-silicon thin film transistor array substrate, 9 to 12 photomask processes are basically required to achieve the low temperature poly-silicon thin film transistor array substrate, resulting in increased costs and decreased competitiveness.

Figure 1:
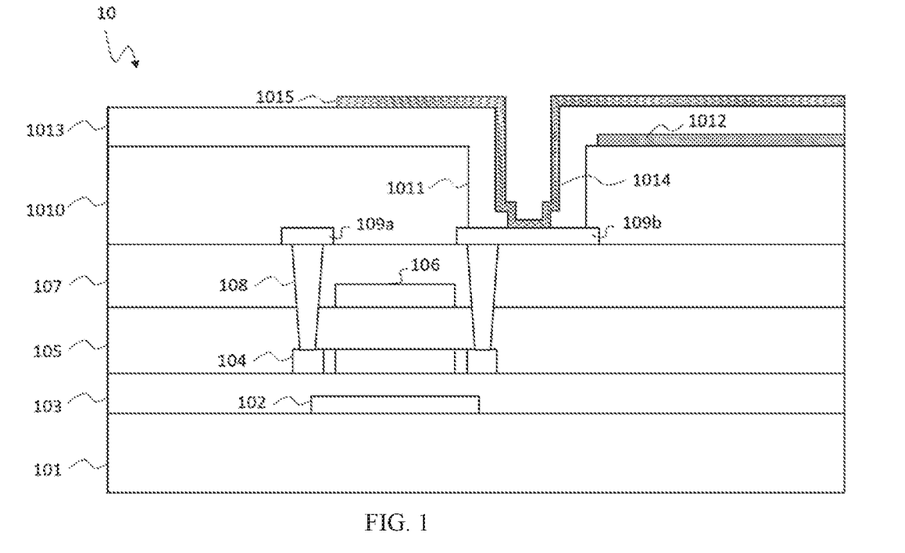
FIG. 1 is a schematic diagram showing a low temperature poly-silicon thin film transistor array substrate in the prior art.

Referring to FIG. 1, which is a schematic diagram showing a low temperature poly-silicon thin film transistor array substrate 10 in the prior art. A method for manufacturing the low temperature poly-silicon thin film transistor array substrate 10 includes steps of:

Step S10: providing a base substrate 101.

Step S11: forming a light shielding layer 102, a buffer layer 103, and an active layer 104 on the base substrate 101 in sequence, wherein the light shielding layer 102 is formed by using a first photomask, and the active layer 104 is formed by using a second photomask.

Step S12: forming heavily-doped areas of a source and drain on the active layer 104 by using a third photomask.

Step S13: forming a gate insulation layer 105 on the active layer 104, and forming a gate electrode 106 on the gate insulation layer 105 by using a fourth photomask, then lightly doping the source and drain of the active layer 104 by taking the gate electrode 106 as a hard mask.

Step S14: forming an inter insulation layer 107 on the gate electrode 106.

Step S15: perforating the gate insulation layer 105 and the inter insulation layer 107 to form a first via 108 by using a fifth photomask, wherein positions of the first via 108 respectively correspond to positions of the source and drain, and a source electrode 109a and a drain electrode 109b are formed by using a sixth photomask.

Step S16: depositing an insulation layer on the inter insulation layer 107, the source electrode 109a, and the drain electrode 109b, and polishing to form a planarization layer 1010 with a flat upper surface, wherein the planarization layer 1010 is provided with a second via 1011 at a position corresponding to the drain electrode 109b by using a seventh photomask, and the drain electrode 109b is exposed.

Step S17: forming a first transparent conductive layer 1012 as a common electrode on the planarization layer 1010 by using an eighth photomask.

Step S18: forming a passivation layer 1013 on the planarization layer 1010 and the first transparent conductive layer 1012, and perforating the planarization layer 1010 and the passivation layer 1013 to form a third via 1014 at a position corresponding to the drain electrode 109b by using a ninth photomask, wherein the drain electrode 109b is exposed again.

Step S19: forming a second transparent conductive layer 1015 as a pixel electrode on the passivation layer 1013 by using a tenth photomask.

In the prior art, a thickness of the planarization layer 1010 is thicker, and two or more etching processes (with two or more photomasks) are required to form the vias thereon.

Based on the above description, 10 photomask-processes are required to form the low temperature poly-silicon thin film transistor array substrate 10. If a touch panel (TP) is to be further integrated into the low temperature poly-silicon thin film transistor array substrate 10, an additional photomask-process is required to form a via for connection. That is, 11 photomask-processes are required to form the low temperature poly-silicon thin film transistor array substrate in the prior art.

Therefore, in order to reduce the costs for manufacturing the low temperature poly-silicon thin film transistor array substrate, it is necessary to provide a display panel, and an array substrate and a manufacturing method thereof to solve the problems in the prior art.

SUMMARY OF THE INVENTION

An objective of the present invention is to provide a display panel, an array substrate, and a manufacturing method thereof to solve a problem that a low temperature poly-silicon thin film transistor array substrate needs to be manufactured by multiple photomask-processes, resulting in increased costs.

To achieve the objective described above, a first aspect of the present invention provides an array substrate, comprising:

a thin film transistor device, comprising a gate electrode, a source electrode, and a drain electrode;

an interface layer, covering the source electrode and the drain electrode;

a first transparent conductive layer, formed on the interface layer;

a passivation layer, formed on the interface layer and the first transparent conductive layer; and a second transparent conductive layer, formed on the passivation layer, wherein the interface layer and the passivation layer are provided with a first via at a position corresponding to the drain electrode, the passivation layer is provided with a second via at a position corresponding to a portion of the first transparent conductive layer, and the first transparent conductive layer is electrically connected to the drain electrode through the first via and the second via.

Further, the second transparent conductive layer comprises a drain electrode connection area and a conductive area, and the drain electrode connection area and the conductive area are electrically disconnected by a slit formed between the drain electrode connection area and the conductive area.

Further, the first via and the second via are filled with a material of the second transparent conductive layer in the drain electrode connection area.

Further, the slit is defined at a periphery of an area where a projection of the source electrode and the drain electrode in a vertical direction overlaps with the second transparent conductive layer.

Further, the thin film transistor device is an n-type metal-oxide-semiconductor transistor.

Further, the first transparent conductive layer is a pixel electrode, and the second transparent conductive layer is a common electrode.

Further, the thin film transistor array substrate further comprise a touch electrode covered by the interface layer, the interface layer and the passivation layer are provided with a third via at a position corresponding to the touch electrode, and the touch electrode is electrically connected to the second transparent conductive layer through the third via.

Further, a thickness of the interface layer ranges from 0.1 micrometers to 0.5 micrometers.

Further, the thin film transistor device comprises:
an active layer;
a gate insulation layer, covering the active layer;
the gate electrode, formed on the gate insulation layer;
an inter insulation layer, covering the gate electrode and the gate insulation layer; and
the source electrode and the drain electrode, formed on the inter insulation layer, wherein the source electrode and the drain electrode are disposed corresponding to and electrically connected to a source and a drain formed on the active layer, respectively.

A second aspect of the present invention provides a method for manufacturing an array substrate, comprising steps of:
forming a thin film transistor device comprising a gate electrode, a source electrode, and a drain electrode;
forming an interface layer to cover the source electrode and the drain electrode;
forming a first transparent conductive layer on the interface layer;
forming a passivation layer on the interface layer and the first transparent conductive layer;
perforating the interface layer and the passivation layer to form a first via, wherein the first via is located at a position corresponding to the drain electrode;
perforating the passivation layer to form a second via, wherein the second via is located at a position corresponding to a portion of the first transparent conductive layer; and
forming a second transparent conductive layer on the passivation layer,
wherein the first transparent conductive layer is electrically connected to the drain electrode through the first via and the second via.

Further, forming the thin film transistor device comprises steps of:
forming an active layer;
forming a gate insulation layer to cover the active layer;
forming the gate electrode, and using the gate electrode as a hard mask to form a doped source and drain on the active layer;
forming an inter insulation layer on the gate insulation layer to cover the gate electrode and the gate insulation layer; and
perforating the gate insulation layer and the inter insulation layer at positions corresponding to the source and drain to form source and drain vias, respectively;
forming the source electrode and the drain electrode on the inter insulation layer, wherein the source electrode and the drain electrode are electrically connected to the source and the drain through the source and drain vias, respectively.

Further, the active layer is transformed from amorphous silicon to polycrystalline silicon by excimer laser annealing.

Further, a drain electrode connection area and a conductive area are formed at the second transparent conductive layer, and the drain electrode connection area and the conductive area are electrically disconnected by a slit formed between the drain electrode connection area and the conductive area.

Further, the first via and the second via are filled with a material of the second transparent conductive layer in the drain electrode connection area.

Further, the slit is formed at a periphery of an area where a projection of the source electrode and the drain electrode in a vertical direction overlaps with the second transparent conductive layer.

Further, the thin film transistor device is an n-type metal-oxide-semiconductor transistor.

Further, the first transparent conductive layer is a pixel electrode, and the second transparent conductive layer is a common electrode.

Further, while forming the source electrode and the drain electrode, a touch electrode is further formed, the touch electrode is covered by the interface layer, the interface layer and the passivation layer are provided with a third via at a position corresponding to the touch electrode, and the touch electrode is electrically connected to the second transparent conductive layer through the third via.

Further, a thickness of the interface layer ranges from 0.1 micrometers to 0.5 micrometers.

A third aspect of the present invention provides a display panel, comprising any one of the thin film transistor array substrate described above.

According to the present invention, by replacing a planarization layer in the prior art with an interface layer, performing one photomask-process to form heavily-doped areas and lightly doped drain areas of a source and drain with a gate re-etching process, as well as pairing with a structure of an array substrate described in the present invention and perforating the interface layer and a passivation layer to simultaneously form a deep via and a shallow via by using one photomask, the number of photomasks required to form the array substrate is reduced to 8. It effectively reduces costs of production materials and costs of photomasks. Further, the present invention further provides a technical solution for solving a parasitic capacitance caused by the replacement of the interface layer. It can be seen that the present invention has high practicability and utilization, and its advantages are very obvious compared with the prior art.

DESCRIPTION OF SPECIFIC EMBODIMENTS OF THE INVENTION

To make objectives, technical schemes, and effects of the present invention clearer and more specific, the present invention is described in further detail below with reference to the drawings. It should be understood that the specific embodiments described herein are merely for explaining the present invention, a term "embodiment" used in the specification of the present invention means an example, instance, or illustration, and are not intended to limit the present invention.

The present invention provides a display panel, an array substrate, and a manufacturing method thereof, which have effects of reducing a number of photomasks required for preparing the array substrate and reducing production costs. To facilitate understanding of the present invention, the array substrate of the present invention may be a low temperature poly-silicon (LTPS) thin film transistor array (TFT array) substrate.

Figure 2:
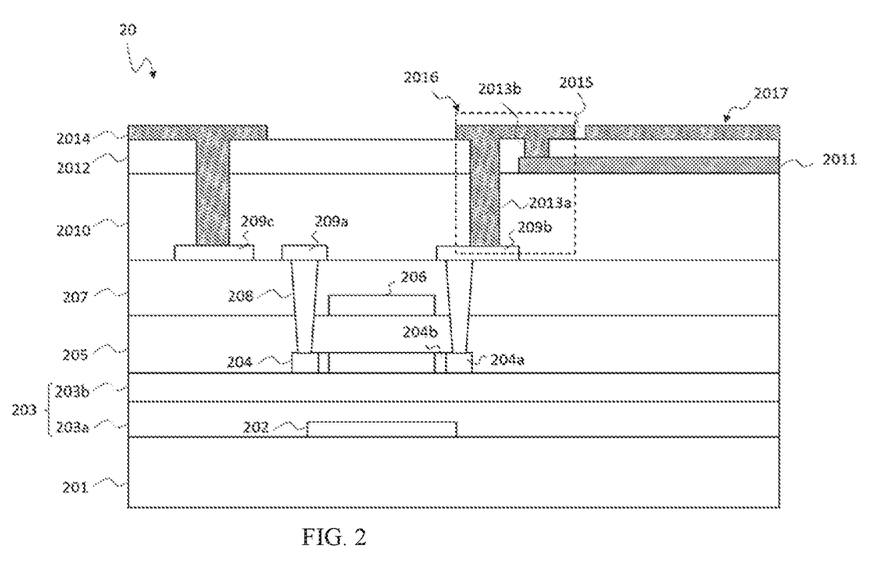
FIG. 2 is a schematic diagram showing an array substrate according to an embodiment of the present invention.
Figure 3:
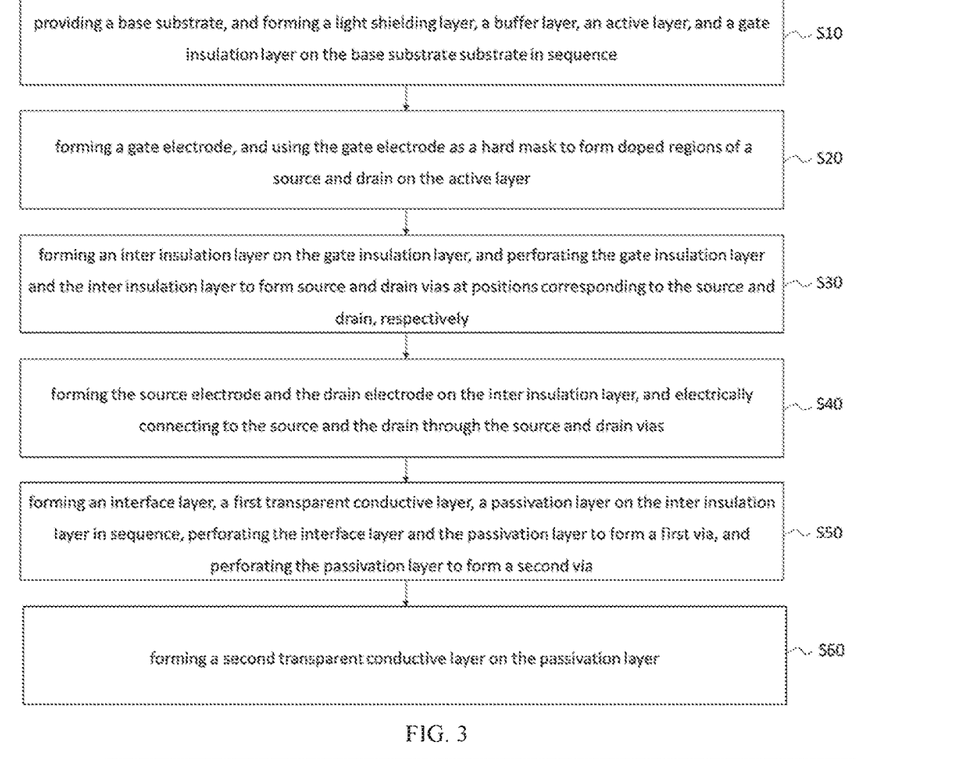
FIG. 3 is a flowchart of a method for manufacturing the array substrate according to an embodiment of the present invention.

Refer to FIG. 2, which is a schematic diagram showing the array substrate according to an embodiment of the present invention. The array substrate 20 in the present invention includes a base substrate 201, and a light shielding layer 202, a buffer layer 203, an active layer 204, a gate insulation layer 205, a gate electrode 206, an inter insulation layer 207, a source electrode 209a and drain electrode 209b, an interface layer (or interfacial layer, IL) 2010, a first transparent conductive layer 2011, a passivation layer 2012, and a second transparent conductive layer 2014 which are formed on the base substrate 201 in sequence, wherein the gate insulation layer 205 and the inter insulation layer 207 are provided with source and drain vias 208 at positions corresponding to a source and drain, respectively, and the source electrode 209a and the drain electrode 209b are electrically connected to the source and drain located at the active layer 204 by the source and drain vias 208, respectively. The interface layer 2010 and the passivation layer 2012 are provided with a first via 2013a at a position corresponding to the drain electrode 209b, the passivation layer 2012 is provided with a second via 2013b at a position corresponding to a portion of the first transparent conductive layer 2011, and the first transparent conductive layer 2011 is electrically connected to the drain electrode 209b by the first via 2013a and the second via 2013b.

In the present embodiment, the first transparent conductive layer 2011 serves as a pixel electrode in the present invention, and the second transparent conductive layer 2014 serves as a common electrode in the present invention. For the sake of convenience, the "pixel electrode" and "common electrode" are referred and are used for description below.

In the present embodiment, the base substrate 201 may be a glass substrate or a resin substrate, and a material of the light shielding layer 202 may be made of a metal material in black color, they are not specifically limited by the present invention.

In the present embodiment, the buffer layer 203 is formed of two insulation materials. Specifically, a silicon-nitride (SiNx) thin film 203a is deposited on the base substrate 201 to isolate metal atoms in the base substrate 201 from diffusing to the active layer 204 formed on the buffer layer 203 for preventing an electrical impact on the active layer 204. However, lattice constants of the SiNx thin film 203a and the active layer 204 are mismatched. Therefore, in order to prevent unnecessary lattice defects caused by the mismatched lattice constants on the active layer 204, a silicon-oxide (SiOx) thin film 203b is deposited on the SiNx thin film 203a for preventing the problem of the lattice defects. Further, after the buffer layer 203 is prepared, an annealing treatment may be performed to optimize quality of the buffer layer 203. In another embodiment, the buffer layer 203 may be formed of single insulation material (such as SiOx thin film). It can be understood that the material and a structure of the buffer layer 203 should not be used to limit the present invention.

In the present embodiment, in order to improve carrier mobility, excimer-laser annealing (ELA) is preferably used to transform the active layer 204 from amorphous silicon (a-Si) to polycrystalline silicon in the present invention. Specifically, the active layer 204 with amorphous silicon may be deposited on the buffer layer 203 by means of plasma-enhanced chemical vapor deposition (PECVD), then high-energy laser pulses generated by an excimer laser device are incident on a surface of the amorphous silicon thin film, so that the amorphous silicon thin film melts in an instant when it receives energy having an extremely high-temperature, and a conversion of amorphous silicon to polycrystalline silicon is realized. In another embodiment, the polycrystalline silicon can also be prepared by means of solid phase crystallization (SPC) or metal induced crystallization (MIC), and the like. It can be understood that the excimer laser annealing is used as a preferred embodiment to illustrate the present invention in the present invention, and it should not be used to limit the present invention.

In the present embodiment, as a size of a metal-oxide-semiconductor field effect transistor (MOSFET) device is shrinking, a hot carrier effect in the device is becoming more and more serious. Therefore, in order to improve operation stability of the device and leakage currents of the device under a negative bias, lightly doped drain (LDD) areas 204b are formed in a channel of the active layer 204 adjacent to heavily-doped areas 204a of a source and drain in the low temperature poly-silicon thin film transistor array substrate 20. By means of gate re-etching technology, the heavily-doped areas 204a and lightly doped drain areas 204b of the source and drain are realized in the present invention. Specifically, when a blanket gate electrode layer (unmarked) is formed on the gate insulation layer 205, photolithography and etching processes are performed on the blanket gate electrode layer through one photomask, and a gate pattern (unmarked) treated with the photolithography and etching processes is taken as a hard mask, then n-type ions (such as phosphorus ions P+) is heavily doped to both ends of the active layer 204 to form the heavily-doped areas 204a of the source and drain. After then, the gate pattern is re-etched to obtain the gate electrode 206, and un-doped areas adjacent to the heavily-doped areas 204a of the source and drain in the channel of the active layer 204 are exposed. More, the gate electrode 206 is taken as a hard mask, and n-type ions (such as phosphorus ions P−) are lightly doped to the active layer 204 to form the LDD areas 204b, thereby the heavily-doped areas 204a and lightly doped drain areas 204b of the source and drain are realized.

In another embodiment, a photoresist pattern with a pattern of the heavily-doped areas 204a of the source and drain is formed on the active layer 204 through one photomask, then n-type ions are heavily doped. After the photoresist pattern is removed, the gate insulation layer 205 and the blanket gate electrode layer (unmarked) are deposited on the buffer layer 203 in sequence, and the blanket gate electrode layer is performed with photolithography and etching processes by using another photomask to obtain the gate electrode 206. At this time, un-doped areas adjacent to the heavily-doped areas 204a of the source and drain in the channel of the active layer 204 are exposed. Furthermore, the gate electrode 206 is taken as a hard mask, and n-type ions is lightly doped to the active layer 204 to form the LDD areas 204b, thereby the heavily-doped areas 204a and lightly doped drain areas 204b of the source and drain are realized.

The gate re-etching technology is preferably used to reduce the number of photomasks used to prepare the heavily-doped areas 204a and lightly doped drain areas 204b of the source and drain and to reduce the production costs in the present invention.

In the present embodiment, the low temperature poly-silicon thin film transistor array 20 is an n-type metal-oxide-semiconductor (NMOS) transistor. In another embodiment, the low temperature poly-silicon thin film transistor array 20 may also be a p-type metal-oxide-semiconductor (PMOS) transistor or a complementary metal-oxide-semiconductor (CMOS) transistor. Further, a difference between the NMOS transistor and the PMOS transistor is species of ions doped into the areas of the source and drain. If the ion species doped into the areas of the source and drain is an n-type semiconductor, it is the NMOS transistor. If the ion species is a p-type semiconductor (such as boron ion), it is the PMOS transistor, and the CMOS transistor can be jointly formed by the NMOS transistor and the PMOS transistor. The NMOS transistor array substrate is used as a preferred embodiment in the present invention, and the present invention should not be limited thereby.

In the present embodiment, a planarization layer in the prior art is replaced by the interface layer 2010 formed on the inter insulation layer 207 and covering the source electrode 209a and the drain electrode 209b in the present invention. Because the interface layer 2010 is composed of an inorganic material and has a thinner film thickness than the planarization layer, there is no need to use two or more photomasks (or etching processes) when perforating the interface layer to form vias, and the number of photomasks is reduced, thus reducing the production costs. Specifically, the interface layer 2010 may be composed of a nitride-oxide material, and a thickness of the interface layer 2010 preferably ranges from 0.1 micrometers to 0.5 micrometers (a thickness of the planarization layer ranges around from 2 micrometers to 3 micrometers). However, although the planarization layer has a greater thickness, it has an effect of reducing a parasitic capacitance between the source electrode 209a and the drain electrode 209b and a common electrode 2014. It can be understood that when the planarization layer is replaced by the interface layer 2010, the parasitic capacitance will inevitably increase. In order to solve this issue, by forming a slit 2015 on the common electrode 2014, the parasitic capacitance generated in the thin film transistor is disconnected, and the parasitic capacitance is maximally confined in an area of the thin film transistor. The slit 2015 is defined at a periphery of an area where a projection of the source electrode 209a and the drain electrode 209b in a vertical direction overlaps with the common electrode 2014.

Further, since the planarization layer with the greater thickness is replaced by the interface layer 2010 with the lesser thickness, the first via 2013a and the second via 2013b can be formed by using only one photomask. Specifically, a photoresist pattern with a pattern of the first via 2013a and a pattern of the second via 2013b is formed on the passivation layer 2012 through one photomask, then a first etching process is performed in an etching stage until the first via 2013a is etched to an upper surface of the interface layer 2010 and the second via 2013b is etched to the pixel electrode 2011. Accordingly, when performing the first etching process, etching gas with a high selectivity that easily etches a material of the passivation layer 2012 while does not easily etch materials of the interface layer 2010 and the pixel electrode 2011 must be selected. Next, a second etching process is performed in the etching stage. Since the second via 2013b has been formed, no further etching processes are required. But, the first via 2013a needs to be etched again to the drain electrode 209b. When performing the second etching process, etching gas with a high selectivity that easily etches the material of the interface layer 2012 while does not easily etch the material of the pixel electrode 2011 and a material of the drain electrode 209b must to be selected, so that the second via 2013b is not affected when the first via 2013a continues to be formed. It can be understood that regardless of the selectivity of the etching gas, the thin films will be etched, and it is just a difference in an etching rate. Therefore, in a case of adopting the interface layer 2010 with the lesser thickness, there is a little difference in depths of the first via 2013a and the second via 2013b. Compared with etching the planarization layer, etching the interface layer 2010 has more etching buffer, which allows more choices in choosing the etching gas. That is, the etching gas with high selectivity or even medium to high selectivity can be selected to achieve a technical effect of forming a deep via and a shallow via under the permission of the etching buffer in the present invention. Based on the above description, the drain electrode may be electrically connected to the pixel electrode 2011 through the first via 2013a and the second via 2013b. Compared with the prior art that two photomasks are required to perforate to make the drain electrode connect to the pixel electrode (such as the seventh photomask and the ninth photomask in the background), photomasks required for manufacturing the low temperature poly-silicon thin film transistor array substrate is maximally reduced in the present invention.

In the present embodiment, the common electrode 2014 includes a drain electrode connection area 2016 (as a dotted box shown in FIG. 2, the dotted box is merely for illustration, it does not represent a structure in the present invention) and a conductive area 2017. The drain electrode connection area 2016 is an area where the pixel electrode 2011 is electrically connected to the drain electrode 209b through the first via 2013a and the second via 2013b, and the conductive area 2017 can be used as an electrode cooperating with the pixel electrode 2011 to make liquid crystals twist, or an electrode cooperating with the pixel electrode 2011 to forms a storage capacitor in a liquid crystal display panel. It can be understood that uses of the conductive area 2017 are not limited in the present invention.

Further, a slit 2015 is formed between the drain electrode connection area 2016 and the conductive area 2017, and the slit 2015 is used to electrically disconnect the drain electrode connection area 2016 and the conductive area 2017. Furthermore, the parasitic capacitance generated in the thin film transistor is disconnected, and the parasitic capacitance is maximally confined in the area of the thin film transistor (i.e. drain electrode connection area 2016) without affecting the conductive area 2017.

In the present embodiment, the first via 2013a and the second via 2013b are filled with a material of the second transparent conductive layer 2014 in the drain electrode connection area 2016. In another embodiment, the first via 2013a and the second via 2013b may also be filled with a material different from the material of the second transparent conductive layer 2014 in the drain electrode connection area 2016.

In the present embodiment, the low temperature polysilicon thin film transistor array substrate 20 further includes a touch electrode 209c, which is formed simultaneously with the source electrode 209a and the drain electrode 209b, and is covered by the interface layer 2010. The interface layer 2010 and the passivation layer 2012 are provided with a third via (unmarked) at a position corresponding to the touch electrode 209c, and the touch electrode 209c is electrically connected to the common electrode 2014 through the third via. Compared with the prior art, the touch electrode 209c can be integrated into the display panel during a process of preparing the thin film transistor array substrate without an additional photomask to form an in-cell touch display panel.

Figure 4A:
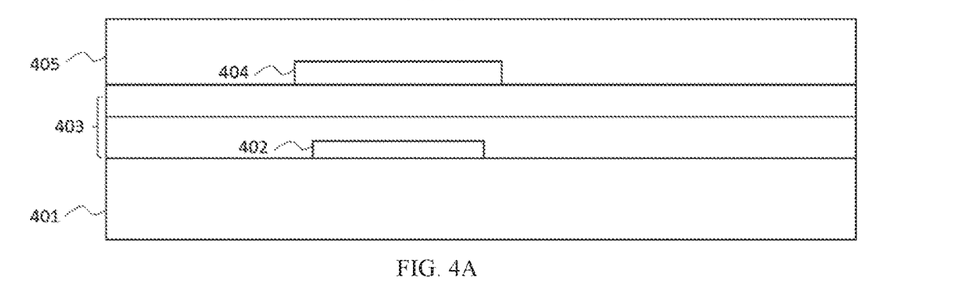
FIGS. 4A, 4B, 4C, 4D, 4E and 4F are schematic diagrams showing each step of the method for manufacturing the array substrate according to the embodiment of the present invention.

Referring to FIG. 3 and FIGS. 4A-4F, FIG. 3 is a flowchart of a method for manufacturing the array substrate according to an embodiment of the present invention, and FIGS. 4A-4F are schematic diagrams showing each step of the method for manufacturing the array substrate according to an embodiment of the present invention. The manufacturing method includes steps of:

Step S10: providing a base substrate 401, and forming a light shielding layer 402, a buffer layer 403, an active layer 404, and a gate insulation layer 405 on the base substrate 401 in sequence, as shown in FIG. 4A.

In this step, when a blanket light shielding layer (unmarked) is formed on the base substrate 401, photolithography and etching processes are performed through one photomask to form the light shielding layer 402.

In this step, when a blanket active layer (unmarked) is formed on the buffer layer 403, photolithography and etching processes are performed through one photomask to form the active layer 404. In addition, in order to improve carrier mobility, excimer-laser annealing is preferably used to transform the active layer 404 from amorphous silicon to polycrystalline silicon in the present invention. In another embodiment, the polycrystalline silicon can also be prepared by means of solid phase crystallization (SPC) or metal induced crystallization (MIC), and the like. It can be understood that the excimer laser annealing is used as a preferred embodiment to illustrate the present invention in the present invention, and it should not be used to limit the present invention.

Figure 4B:
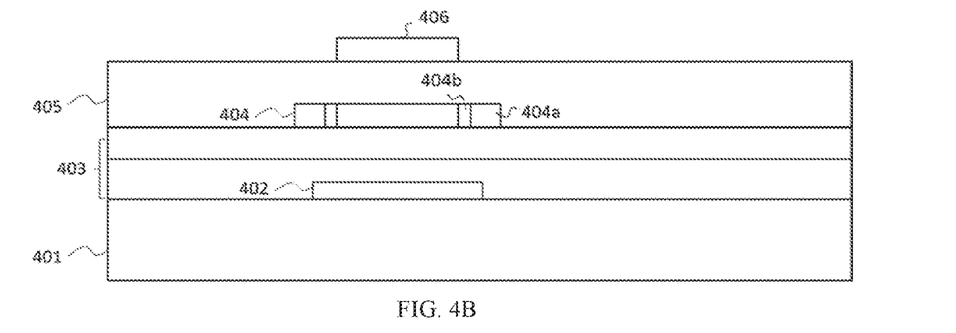

Step S20: forming a gate electrode 406, and using the gate electrode 406 as a hard mask to form doped areas of a source and drain on the active layer 404, as shown in FIG. 4B.

In this step, by means of gate re-etching technology, heavily-doped areas 404a and lightly doped drain areas 404b of the source and drain are realized in the present invention. Specifically, when a blanket gate electrode layer (unmarked) is formed on the gate insulation layer 405, photolithography and etching processes are performed on the blanket gate electrode layer through a first photomask, and a gate pattern (unmarked) treated with the photolithography and etching processes is taken as a hard mask, then ions are heavily doped to both ends of the active layer 404 to form the heavily-doped areas 404a of the source and drain. Afterwards, the gate pattern is re-etched to obtain the gate electrode 406, and un-doped areas adjacent to the heavily-doped areas 404a of the source and drain in a channel of the active layer 404 are exposed. Moreover, the gate electrode 406 is taken as a hard mask, and ions are lightly doped to the active layer 404 to form lightly doped drain areas 404b, thereby the heavily-doped areas 404a and lightly doped drain areas 404b of the source and drain are realized. The gate re-etching technology is preferably used to reduce the number of photomasks used to prepare the heavily-doped areas 404a and lightly doped drain areas 404b of the source and drain and to reduce production costs in the present invention.

Figure 4C:
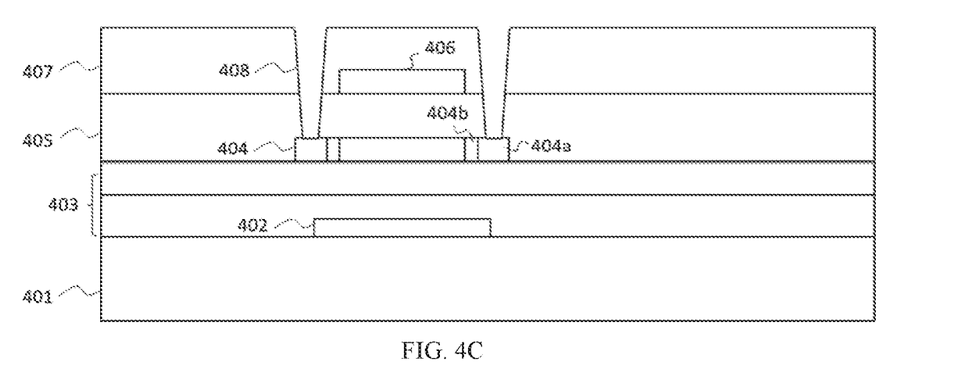

Step S30: forming an inter insulation layer 407 on the gate insulation layer 405, and perforating the gate insulation layer 405 and the inter insulation layer 407 to form source and drain vias 408 at positions corresponding to the source and drain, respectively, as shown in FIG. 4C.

In this step, a photoresist pattern with a pattern of the source and drain vias 408 is formed on the inter insulation layer 407 through one photomask, and the source and drain vias 408 are formed through photolithography and etching processes.

Figure 4D:
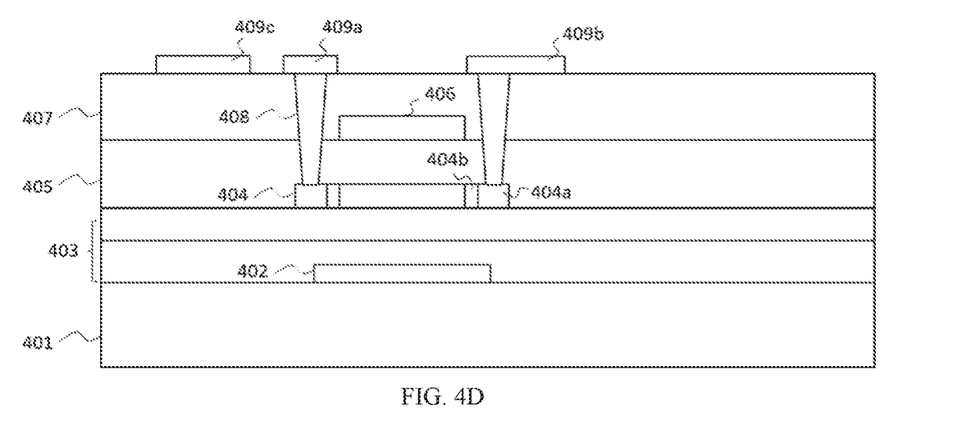

Step S40: forming the source electrode 409a and the drain electrode 409b on the inter insulation layer 407, and electrically connecting to the source and the drain through the source and drain vias 408, respectively, as shown in FIG. 4D.

In this step, when a blanket source/drain metal layer (unmarked) is formed on the inter insulation layer 407, the blanket source/drain metal layer is filled in the source and drain vias 408, and the blanket source/drain metal layer is etched through one photomask to form the source electrode 409a and the drain electrode 409b.

In this step, during etching processes performed on the blanket source/drain metal layer, the touch electrode 409c may be formed simultaneously with the source electrode 409a and the drain electrode 409b and be disposed on the inter insulation layer 407, and the touch electrodes are integrated in a display panel.

Figure 4E:
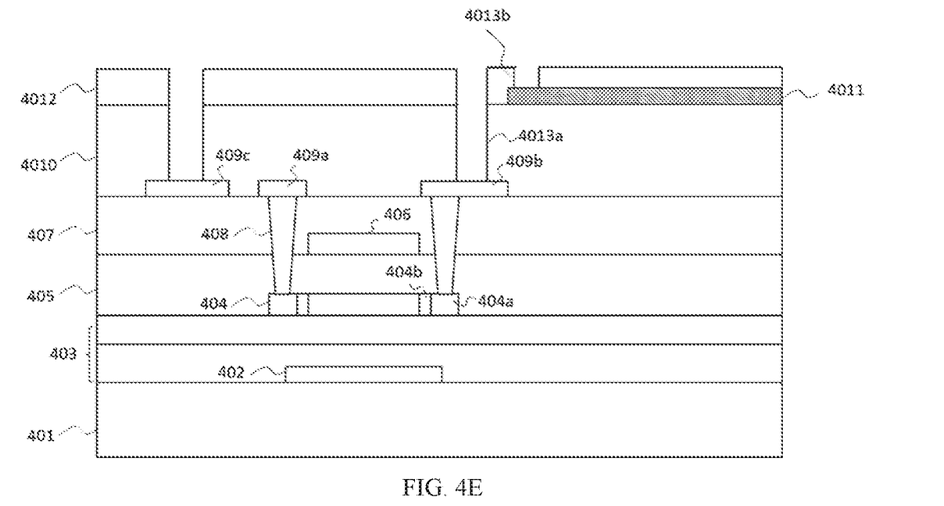

Step S50: forming an interface layer (or interfacial layer, IL) 4010, a first transparent conductive layer 4011, and a passivation layer 4012 on the inter insulation layer 407 in sequence, perforating the interface layer 4010 and the passivation layer 4012 to form a first via 4013a, and perforating the passivation layer 4012 to form a second via 4013b, as shown in FIG. 4E.

In this step, when a blanket first transparent conductive layer (unmarked) is formed on the interface layer 4010, photolithography and etching processes are performed on the blanket first transparent conductive layer through one photomask to form the first transparent conductive layer 4011.

In this step, a photoresist pattern of the first via 4013a and a photoresist pattern of the second via 4013b are formed on the passivation layer 4012 through a second photomask, and are treated with photolithography and etching processes to form the first via 4013a and the second via 4013b. Etching gas with high selectivity or even medium to high selectivity can be selected to achieve a technical effect of forming a deep via and a shallow via through one photomask under the permission of etching buffer in the present invention. It has been described in detail above and will not be repeated here.

In this step, since the touch electrode 409c is covered by the interface layer 4010, when the first via 4013a and the second via 4013b are formed, a third via is formed in the interface layer 4010 at a position corresponding to the touch electrode 409c through the second photomask at the same time.

Figure 4F:
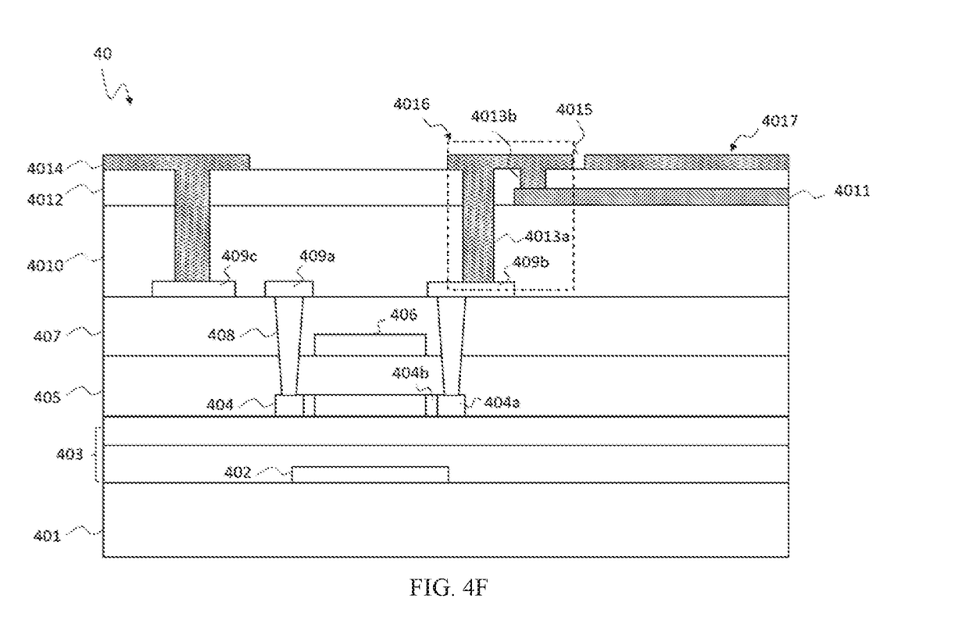

Step S60: forming a second transparent conductive layer 4014 on the passivation layer 4012.

In this step, when a blanket second transparent conductive layer (unmarked) is formed on the passivation layer 4012, photolithography and etching processes are performed on the blanket second transparent conductive layer through a third photomask to form the first transparent conductive layer 4014.

Further, the second transparent conductive layer 4014 includes a drain electrode connection area 4016 (as a dotted box shown in FIG. 4F, the dotted box is merely for illustration, it does not represent a structure of the present invention) and a conductive area 4017, and a slit 4015 is formed between the drain electrode connection area 4016 and the conductive area 4017 to electrically disconnect the drain electrode connection area 4016 and the conductive area 4017. Moreover, in order to solve a problem of an increased parasitic capacitance caused by replacing the planarization layer with the interface layer 4010, the slit 4015 can be used to disconnect the parasitic capacitance generated in the thin film transistor, and the parasitic capacitance is maximally confined in an area of the thin film transistor (i.e. drain electrode connection area 4016) without affecting the conductive area 4017.

In this step, the first via 4013a and the second via 4013b are filled with a material of the second transparent conductive layer 4014 in the drain electrode connection area 4016. In another embodiment, the first via 4013a and the second via 4013b may also be filled with a material different from the material of the second transparent conductive layer 4014 in the drain electrode connection area 4016.

In this step, the drain electrode connection area 4016, the conductive area 4017, and the slit 4015 are simultaneously formed through the third photomask.

Other technical details of the method for manufacturing the low temperature poly-silicon thin film transistor array substrate provided by the present invention may refer to the above description about the low temperature poly-silicon thin film transistor array substrate, and will not be repeated here.

In summary, the low temperature poly-silicon thin film transistor array substrate 40 provided by the present invention can be prepared by using only eight photomasks which are used in the formation of the light shielding layer 402, the active layer 404, the gate electrode 406, the source and drain vias 408, the source electrode 409a and the drain electrode 409b, the first transparent conductive layer 4011, the first via 4013a and the second via 4013b, and the second transparent conductive layer 4014, specifically.

According to the present invention, by replacing the planarization layer in the prior art with the interface layer, performing one photomask-process to form the heavily-doped areas and the lightly doped drain areas of the source and drain with the gate re-etching process, as well as pairing with the structure of the array substrate described in the present invention and perforating the interface layer and the passivation layer to simultaneously form the deep via and the shallow via by using one photomask, the number of photomasks required to form the low temperature poly-silicon thin film transistor array substrate is reduced to 8. It effectively reduces costs of production materials and costs of photomasks. Further, the present invention further provides a technical solution for solving the parasitic capacitance caused by the replacement of the interface layer. It can be seen that the present invention has high practicability and utilization, and its advantages are very obvious compared with the prior art.

Above all, although the present invention has been disclosed above in the preferred embodiments, the above preferred embodiments are not intended to limit the present invention. For persons skilled in this art, various modifications and alterations can be made without departing from the spirit and scope of the present invention. The protective scope of the present invention is subject to the scope as defined in the claims.

What is claimed is:

1. An array substrate, comprising:
   a thin film transistor device, comprising a gate electrode, a source electrode, and a drain electrode;
   an interface layer, covering the source electrode and the drain electrode, wherein the interface layer is composed of a nitride-oxide material and has a thickness less than a preset value;
   a first transparent conductive layer, formed on the interface layer;
   a passivation layer, formed on the interface layer and the first transparent conductive layer; and
   a second transparent conductive layer, formed on the passivation layer, wherein the second transparent conductive layer comprises a drain electrode connection area and a conductive area, and the drain electrode connection area and the conductive area are electrically disconnected by a slit formed between the drain electrode connection area and the conductive area,
   wherein the interface layer and the passivation layer are provided with a first via at a position corresponding to the drain electrode, the passivation layer is provided with a second via at a position corresponding to a portion of the first transparent conductive layer, and the second transparent conductive layer in the drain electrode connection area is electrically connected to the drain electrode through the first via and is electrically connected to the first transparent conductive layer through the second via.

2. The array substrate as claimed in claim 1, wherein the first via and the second via are filled with a material of the second transparent conductive layer in the drain electrode connection area.

3. The array substrate as claimed in claim 1, wherein the slit is defined at a periphery of an area where a projection of the source electrode and the drain electrode in a vertical direction overlaps with the second transparent conductive layer.

4. The array substrate as claimed in claim 1, wherein the thin film transistor device is an n-type metal-oxide-semiconductor transistor.

5. The array substrate as claimed in claim 1, wherein the first transparent conductive layer is a pixel electrode, and the second transparent conductive layer is a common electrode.

6. The array substrate as claimed in claim 1, further comprising a touch electrode covered by the interface layer, wherein the interface layer and the passivation layer are provided with a third via at a position corresponding to the touch electrode, and the touch electrode is electrically connected to the second transparent conductive layer through the third via.

7. The array substrate as claimed in claim 1, wherein the thickness of the interface layer ranges from 0.1 micrometers to 0.5 micrometers.

8. The array substrate as claimed in claim 1, wherein the thin film transistor device comprises:

an active layer;

a gate insulation layer, covering the active layer;

the gate electrode, formed on the gate insulation layer;

an inter insulation layer, covering the gate electrode and the gate insulation layer; and the source electrode and the drain electrode, formed on the inter insulation layer, wherein the source electrode and the drain electrode are disposed corresponding to and electrically connected to a source and a drain formed on the active layer, respectively.

9. A display panel, comprising the array substrate as claimed in claim 1.

10. A method for manufacturing an array substrate, comprising steps of:

forming a thin film transistor device comprising a gate electrode, a source electrode, and a drain electrode;

forming an interface layer of a nitride-oxide material to cover the source electrode and the drain electrode, wherein the interface layer has a thickness less than a preset value;

forming a first transparent conductive layer on the interface layer;

forming a passivation layer on the interface layer and the first transparent conductive layer;

perforating the interface layer and the passivation layer to form a first via and perforating the passivation layer to form a second via, by using one photomask, wherein the first via is located at a position corresponding to the drain electrode, and the second via is located at a position corresponding to a portion of the first transparent conductive layer; and forming a second transparent conductive layer on the passivation layer, wherein the second transparent conductive layer comprises a drain electrode connection area and a conductive area, and the drain electrode connection area and the conductive area are electrically disconnected by a slit formed between the drain electrode connection area and the conductive area, wherein the second transparent conductive layer in the drain electrode connection area is electrically connected to the drain electrode through the first via and is electrically connected to the first transparent conductive layer through the second via.

11. The method as claimed in claim 10, wherein forming the thin film transistor device comprises steps of:

forming an active layer;

forming a gate insulation layer to cover the active layer;

forming the gate electrode, and using the gate electrode as a hard mask to form a doped source and drain on the active layer;

forming an inter insulation layer on the gate insulation layer to cover the gate electrode and the gate insulation layer;

perforating the gate insulation layer and the inter insulation layer at positions corresponding to the source and drain to form source and drain vias, respectively; and forming the source electrode and the drain electrode on the inter insulation layer, wherein the source electrode and the drain electrode are electrically connected to the source and the drain through the source and drain vias, respectively.

12. The method as claimed in claim 11, wherein the active layer is transformed from amorphous silicon to polycrystalline silicon by excimer laser annealing.

13. The method as claimed in claim 10, wherein the first via and the second via are filled with a material of the second transparent conductive layer in the drain electrode connection area.

14. The method as claimed in claim 10, wherein the slit is formed at a periphery of an area where a projection of the source electrode and the drain electrode in a vertical direction overlaps with the second transparent conductive layer.

15. The method as claimed in claim 10, wherein the thin film transistor device is an n-type metal-oxide-semiconductor transistor.

16. The method as claimed in claim 10, wherein the first transparent conductive layer is a pixel electrode, and the second transparent conductive layer is a common electrode.

17. The method as claimed in claim 10, wherein while forming the source electrode and the drain electrode, a touch electrode is further formed, the touch electrode is covered by the interface layer, the interface layer and the passivation layer are provided with a third via at a position corresponding to the touch electrode, and the touch electrode is electrically connected to the second transparent conductive layer through the third via.

18. The method as claimed in claim 10, wherein the thickness of the interface layer ranges from 0.1 micrometers to 0.5 micrometers.

* * * * *